United States Patent
Ha

(10) Patent No.: US 9,515,250 B2
(45) Date of Patent: Dec. 6, 2016

(54) ELECTRONIC DEVICE AND METHOD FOR FABRICATING THE SAME

(71) Applicant: SK hynix Inc., Icheon-Si (KR)

(72) Inventor: Ga-Young Ha, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/586,748

(22) Filed: Dec. 30, 2014

(65) Prior Publication Data

US 2015/0249204 A1    Sep. 3, 2015

(30) Foreign Application Priority Data

Feb. 28, 2014  (KR) .......................... 10-2014-0024061

(51) Int. Cl.
H01L 23/52     (2006.01)
H01L 43/02     (2006.01)
H01L 43/08     (2006.01)
H01L 27/22     (2006.01)

(52) U.S. Cl.
CPC ............. *H01L 43/02* (2013.01); *H01L 27/228* (2013.01); *H01L 43/08* (2013.01)

(58) Field of Classification Search
CPC ............................... H01L 27/222; H01L 43/02
See application file for complete search history.

(56) References Cited

U.S. PATENT DOCUMENTS

| | | | |
|---|---|---|---|
| 8,564,079 B2 | 10/2013 | Kang et al. | |
| 2007/0045687 A1* | 3/2007 | Kumura | H01L 27/11502 257/295 |
| 2010/0200900 A1* | 8/2010 | Iwayama | B82Y 25/00 257/295 |
| 2013/0075838 A1 | 3/2013 | Chen et al. | |
| 2013/0264620 A1* | 10/2013 | Yu | H01L 23/53238 257/295 |

FOREIGN PATENT DOCUMENTS

KR    10-2015-0037047 A    4/2015

* cited by examiner

*Primary Examiner* — Shaun Campbell
(74) *Attorney, Agent, or Firm* — Perkins Coie LLP

(57) ABSTRACT

An electronic device comprising a semiconductor memory unit includes: variable resistance patterns formed over a substrate; a protective layer formed over the substrate including the variable resistance patterns and including a leakage current blocking layer that is spaced apart from the variable resistance patterns; and contact plugs formed adjacent to the variable resistance patterns over the substrate and penetrating through the protective layer to be coupled with the substrate.

21 Claims, 9 Drawing Sheets

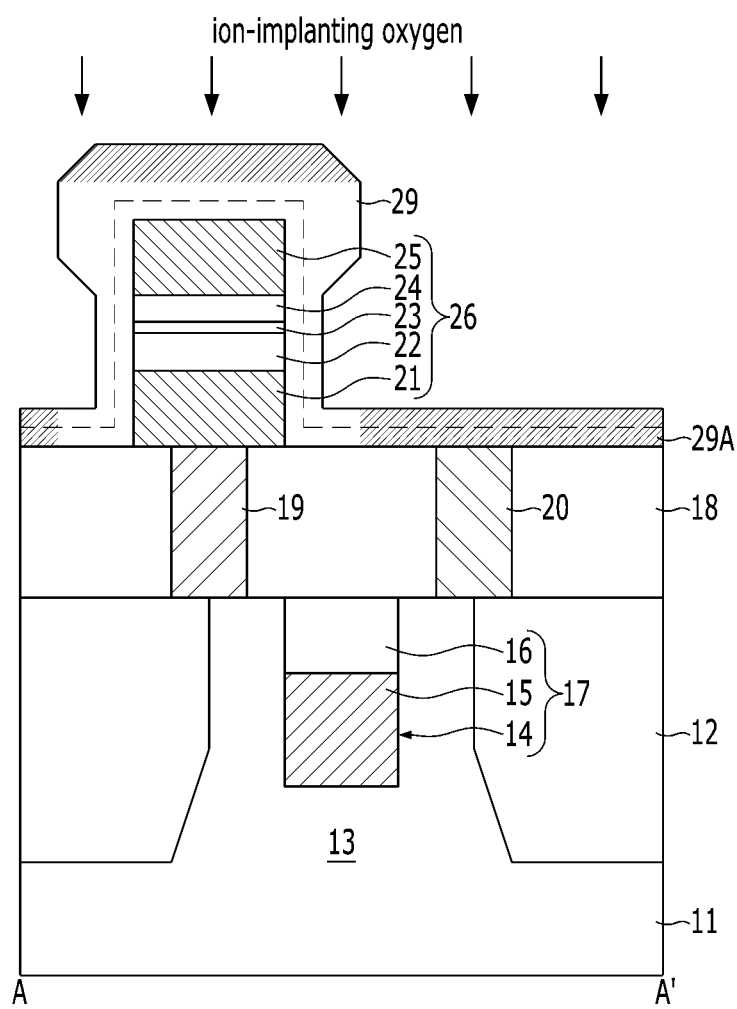

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0024061, entitled "ELECTRONIC DEVICE AND METHOD FOR FABRICATING THE SAME" and filed on Feb. 28, 2014, which is incorporated herein by reference in its entirety.

BACKGROUND

This patent document relates to memory circuits or devices and their applications in electronic devices or system.

Recently, as electronic device or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such semiconductor devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which reliability is improved.

In one aspect, an electronic device including a semiconductor memory unit is provided to include: a first interlayer dielectric layer which is formed over a substrate; a variable resistance pattern formed over the first interlayer dielectric layer; a protective layer formed over the substrate to cover the variable resistance pattern and the first interlayer dielectric layer and including a leakage current blocking layer that may be spaced apart from the variable resistance pattern; and a contact plug formed adjacent to the variable resistance patterns over the substrate and penetrating through the protective layer to be coupled with the substrate.

Implementations of the above method may include one or more of the following.

In some implementations, the leakage current blocking layer is disposed at positions through which the contact plugs penetrate, and the leakage current blocking layer surrounds the contact plugs. In some implementations, the protective layer discontinuously may include the leakage current blocking layer. In some implementations, the leakage current blocking layer may include an oxide that is formed by oxidizing a portion of the protective layer. In some implementations, the protective layer may include a nitride layer, and the leakage current blocking layer may include an oxynitride layer. In some implementations, the variable resistance pattern includes a magnetic tunneling junction including a tunnel barrier interposed between two magnetic layers. In some implementations, the electronic device may further include: a selection element formed in the substrate, and the contact plug is electrically connected to the selection elements. In some implementations, the electronic device further includes another contact plug located above the variable resistance pattern and penetrating through the protective layer to be electrically connected to the variable resistance patterns. In some implementations, the leakage current blocking layer includes a portion formed over the variable resistance pattern and the portion is disposed on a surface of the protective layer or inside the protective layer. In some implementations, the leakage current blocking layer includes a material, which may be different from a material of the protective layer. In some implementations, the protective layer has an overhang portion formed over the variable resistance pattern. In some implementations, the protective layer may further include: a first protective layer and a second protective layer formed over the first protective layer and having an overhang portion around the upper portion of the variable resistance patterns. In some implementations, the first protective layer and the second protective layer includes the same material. In some implementation, he second protective layer may have a denser film quality than the first protective layer.

In one aspect, an electronic device including a semiconductor memory unit is provided to include: a substrate; a first interlayer dielectric layer over the substrate; a variable resistance pattern formed over the first interlayer dielectric layer; a protective layer formed over the first interlayer dielectric layer and the variable resistance pattern, wherein the protective layer includes a first material; and a leakage current blocking layer formed on portions of the protective layer to include a second material having better leakage characteristics than the first material.

Implementations of the above method may include one or more of the following.

In some implementations, the portions of the protective layer may be discontinuous. In some implementations, the first material may include a nitride and the second material includes an oxide. In some implementations, the protective layer may have an overhang portion around an upper portion of the variable resistance pattern. In some implementations, the protective layer may include a first protective layer and a second protective layer and the second protective layer has a superior film quality to the first protective layer. In some implementations, the leakage current blocking layer may be free of a contact with the variable resistance pattern.

In one aspect, an electronic device including a semiconductor memory unit includes: a variable resistance pattern formed over a substrate; a protective layer formed over the substrate to cover the variable resistance pattern and including a leakage current blocking layer that may be spaced apart from the variable resistance pattern; and a contact plug formed adjacent to the variable resistance pattern over the substrate and penetrating through the protective layer to be coupled with the substrate. In some implementations, the electronic device may further include a microprocessor which may include: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation may be performed, wherein the semiconductor memory may be part of the memory unit in the microprocessor. In some implementations, the electronic device may further include a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation may be performed; and a bus interface connected between the core unit and the cache memory unit, and configured to transmit data between the core unit and the cache memory unit, wherein the semiconductor memory may be part of the cache memory unit in the processor. In some implementation, the electronic device may further include a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory may be part of the auxiliary memory device or the main memory device in the processing system. In some implementation, the electronic device may further include a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory may be part of the storage device or the temporary storage device in the data storage system. In some implementation, the electronic device may further include a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory may be part of the memory or the buffer memory in the memory system.

In another aspect, an electronic device is provided to comprise: variable resistance patterns formed over a substrate; a protective layer formed over the substrate including the variable resistance patterns and including a leakage current blocking layer that is formed to be disposed at least over the variable resistance patterns; and first contact plugs penetrating through the protective layer to be electrically connected to the variable resistance patterns. In another aspect, an electronic device is provided to comprise: variable resistance patterns formed over a substrate; a protective layer formed over the substrate including the variable resistance patterns and including a leakage current blocking layer that is formed as a portion of the protective layer is transformed into another material, which is different from a material of the protective layer; and contact plugs formed adjacent to the variable resistance patterns over the substrate and penetrating through the protective layer to be coupled with the substrate. In some implementations, the first protective layer includes a material layer formed through a Chemical Vapor Deposition (CVD) process, and the second protective layer includes a material layer formed through a Physical Vapor Deposition (PVD) process.

In another aspect, a method for fabricating an electronic device is provided to include: forming a variable resistance pattern over a first interlayer dielectric layer over a substrate; forming a protective layer over the first interlayer dielectric layer to cover the profile of the resultant structure including the variable resistance pattern and have an overhang portion over the variable resistance pattern; forming a leakage current blocking layer by oxidizing portions of the protective layer; and forming a contact plug adjacent to the variable resistance pattern to penetrate through the leakage current blocking layer.

In some implementations, wherein the oxidization of the portion of the protective layer is performed by using the overhang portion as an ion implantation barrier and implanting oxygen ions into the protective layer. In some implementations, wherein the forming of the protective layer includes: forming a first protective layer over the profile of the resultant structure including the variable resistance pattern; and forming a second protective layer over the first protective layer to have the overhang portion in an upper portion of the variable resistance pattern. In some implementations, wherein the forming of the first protective layer includes performing a Chemical Vapor Deposition (CVD) process, and the forming of the second protective layer includes performing a Physical Vapor Deposition (PVD) process. In some implementations, wherein the second protective layer has a denser film quality than the first protective layer. In some implementations, wherein the protective layer includes a nitride layer, and the leakage current blocking layer includes an oxynitride layer. In some implementations, wherein the variable resistance pattern includes a magnetic tunneling junction including a tunnel barrier interposed between two magnetic layers.

Those and other aspects of the disclosed technology and their implementations and variations are described in greater detail in the drawings, the description and the claims.

BRIEF DESCRIPTION OF THE DRAWINGS

FIGS. 3A through 3F are cross-sectional views describing an example of a method for fabricating a semiconductor memory in accordance with an implementation of the disclosed technology.

DETAILED DESCRIPTION

Figure 1:
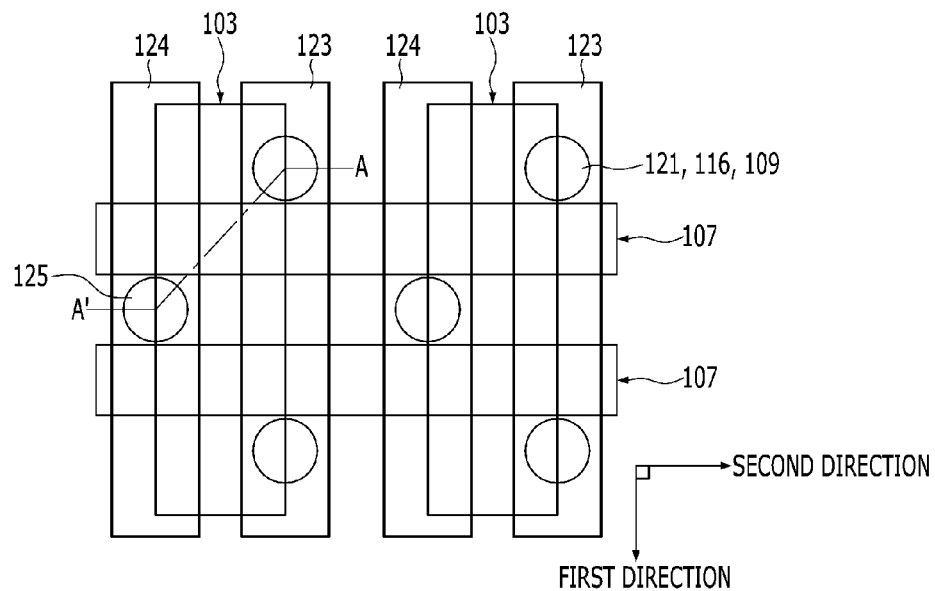
FIG. 1 is a plan view of an example of a semiconductor memory in accordance with an implementation of the disclosed technology.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
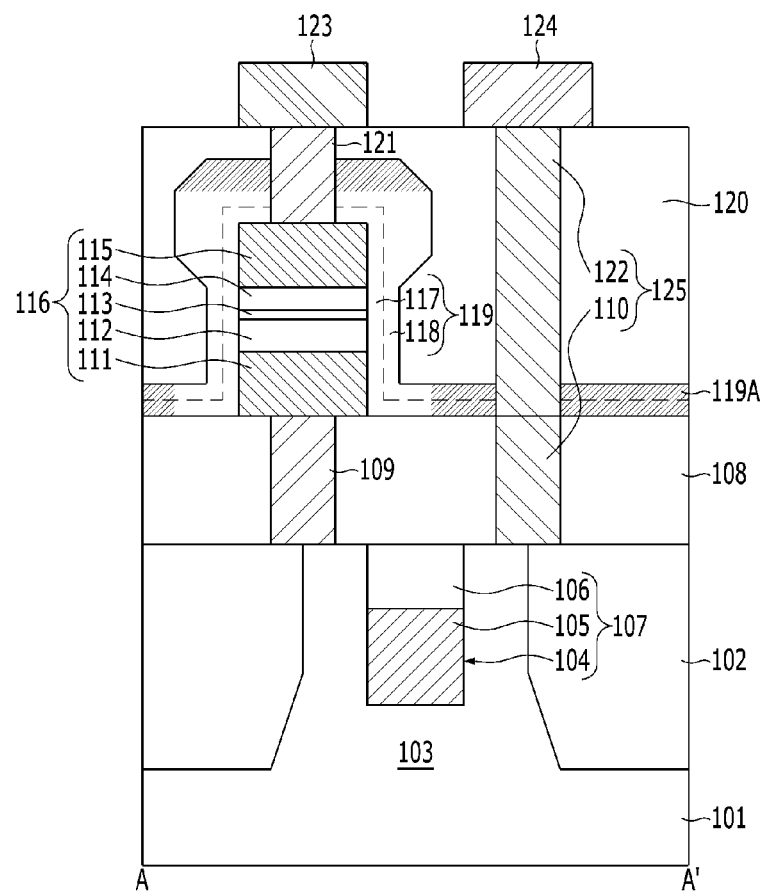
FIG. 2 is a cross-sectional view of the semiconductor memory taken along a line A-A' shown in FIG. 1.

FIG. 1 is a plan view of a semiconductor memory in accordance with an implementation, and FIG. 2 is a cross-sectional view of the semiconductor memory taken along a line A-A' shown in FIG. 1.

Referring to FIGS. 1 and 2, the semiconductor memory may include a variable resistance pattern 116, a protective layer 119, and a source line contact plug 125. The variable resistance pattern 116 is formed over a substrate 101. The protective layer 119 covers a structure including the variable resistance pattern 116. The protective layer 119 includes a leakage current blocking layer 119A that is formed by selectively transforming the original material of the protective layer 119 into a different material. The source line contact plug 125 is formed adjacent to the variable resistance pattern 116 and penetrates through the protective layer 119 or the leakage current blocking layer 119A. The leakage current blocking layer 119A may include an oxide obtained by oxidizing the protective layer 119. The leakage current blocking layer 119A may be formed on portions of the protective layer 119. For example, the leakage current blocking layer 119A may be disposed between the variable resistance patterns 116 and between the variable resistance pattern 116 and the source line contact plug 125. For example, the leakage current blocking layer 119A may be formed to be spaced apart from the variable resistance patterns 116 and contact with the source line contact plug 125. The source line contact plugs 125 may penetrating through the leakage current blocking layer 119A.

Hereafter, the elements of the semiconductor memory will be described in more detail.

The semiconductor memory may include the substrate 101, an isolation layer 102, and a plurality of buried gates 107. The isolation layer 102 is formed in the substrate 101 to define a plurality of active regions 103. The buried gate 107 is formed in the substrate 101.

The substrate 101 may include a semiconductor substrate. The semiconductor substrate may have a monocrystalline state, and include a silicon-containing material. The semiconductor substrate may include a monocrystalline silicon-containing material. For example, the substrate 101 may include a bulk silicon substrate. The substrate 101 may include a Silicon-On-Insulator (SOI) substrate including a stacked structure of a supporting substrate, a buried insulation layer, and a monocrystalline silicon layer.

The isolation layer 102 may be formed through a Shallow Trench Isolation (STI) process to define the active regions 103. Each of the active regions 103 defined by the isolation layer 102 may have a bar shape with a long length in a first direction and a short length in a second direction. The active regions 103 may be arranged in a matrix form.

The buried gate 107 is formed in the substrate 101. The buried gate 107 may function as word lines. Further, the buried gate 107 may function as a selection element for selecting a variable resistance pattern 116. The buried gate 107 may include a trench 104 formed in the substrate 101, a gate insulation layer (not shown) formed on the surface of the trench 104, a gate electrode 105, and a gate sealing layer 106. The gate electrode 105 is formed over the gate insulation layer (not shown) to fill in a gap in a portion of the trench 104. The gate sealing layer 106 is formed over the gate electrode 105 to fill in a gap in the remaining portion of the trench 104. The buried gate 107 may have a line shape that crosses both the active regions 103 and the isolation layer 102. For example, the buried gate 107 may have a line shape extending in the second direction. The buried gate 107 may be arranged to be spaced apart from one other in the first direction.

In this implementation, a transistor with the buried gate 107 is provided as an selection element. However, other implementations are also possible. For example, various elements can be used for controlling the supply of current or voltage the variable resistance patterns 116. Such elements may include a diode or a Metal Insulator Transition (MIT), etc.

The semiconductor memory of the present implementation may include a first inter-layer dielectric layer 108, a first contact plug 109, and a second contact plug 110. The first inter-layer dielectric layer 108 is formed over the substrate 101. The first contact plug 109 penetrates through the first inter-layer dielectric layer 108 to be coupled with the active region 103 on one side of the buried gate 107. The second contact plug 110 is coupled with the active region 103 on another side of the buried gate 107. In one implementation, the first inter-layer dielectric layer 108 may include a single layer including an oxide layer, a nitride layer, or an oxynitride layer. In another implementation, the first inter-layer dielectric layer 108 may include a stacked layer including at least two among an oxide layer, a nitride layer, and an oxynitride layer.

In the first direction, the first contact plug 109 may be disposed on both sides of the active region 103. In the second direction, the first contact plugs 109 may be provided on the right side of the active region 103 to contact with both the active regions 103 and the isolation layer 102. By doing so, the distance between the bit line 123 and the source line 124 can be secured. Each first contact plug 109 may be coupled to the variable resistance pattern 116 and the active region 103. The first contact plug 109 may be referred to as "lower contact" or "lower electrode contact."

In the first direction, the second contact plug 110 may be disposed around the middle of the active region 103. In the second direction, the second contact plug 110 may be provided on one side of the active region 103 to contact with both the active region 103 and the isolation layer 102. The first and second contact plugs 109 and 110 are on opposite sides from each other in the second direction. By doing so, the distance between the bit line 123 and the source line 124 can be secured. Each second contact plug 110 may form a portion of each source line contact plug 125. Each second contact plug may be used to couple the source line 124 with the active region 103. In the semiconductor memory, one second contact plug 110 may be shared by two buried gates 107.

The first contact plug 109 and the second contact plug 110 may be arranged in a zigzag form in the first direction and the second direction. Also, the first contact plug 109 and the second contact plug 110 may be alternately arranged on a straight diagonal line.

The semiconductor memory may include a variable resistance pattern 116. The variable resistance pattern 116 is formed over the first inter-layer dielectric layer 108 to contact with the first contact plug 109. The variable resistance pattern 116 may be switched between two different resistance states in response to a voltage or current applied through the first contact plug 109 and third contact plug 121 which are coupled with the lower and upper portions of the variable resistance patterns 116, respectively. Therefore, the variable resistance pattern 116 may include a variable resistance material that is used in a variable resistance memory in which data are stored or erased based on the change of the resistance characteristics. The variable resistance material may include various materials that are used, for example, for a resistive random access memory (RRAM), a phase change random access memory (PRAM), a ferroelectric random access memory (FRAM), a magnetic random access memory (MRAM), a Spin Transfer Torque Magnetic Random Access Memory (STTRAM) or other suitable memory circuits exhibiting desired variable resistance values. For example, the variable resistance material may include a metal oxide including a transition metal oxide and a ferovskite-based material, a phase-change material including a chalcogenide-based material, a ferromagnetic substance, a magnetic tunnel junction (MTJ) material including a ferromagnetic substance and so on.

As one example, the present implementation employs the variable resistance pattern 116 including a magnetic tunnel junction. The magnetic tunnel junction includes two magnetic layers 112 and 114 and a tunnel barrier layer 113 interposed between the two magnetic layers 112 and 114. The variable resistance pattern 116 may include a stacked structure where a bottom electrode 111, a first magnetic layer 112, the tunnel barrier layer 113, a second magnetic layer 114, and a top electrode 115 are sequentially stacked. In another implementation, the bottom electrode 111 and the top electrode 115 may be substituted with the first contact plugs 109 and the third contact plugs 121, respectively. One of the first magnetic layer 112 and the second magnetic layer 114 serves as a reference layer or a pinned layer whose magnetization direction is fixed, and the other may serve as a free layer whose magnetization direction is changed. In one implementation, each of the first magnetic layer 112 and the second magnetic layer 114 may include a single layer including an iron-platinum (Fe—Pt) alloy, an iron-palladium (Fe—Pd) alloy, a cobalt-palladium (Co—Pd) alloy, a cobalt-platinum (Co—Pt) alloy, an iron-nickel-platinum (Fe—Ni—Pt) alloy, a cobalt-iron-platinum (Co—Fe—Pt) alloy, or a cobalt-nickel-platinum (Co—Ni—Pt) alloy. In another implementation, each of the first magnetic layer 112 and the second magnetic layer 114 may include a multi-layer including at least two of them. In the tunnel barrier layer 113, charges (e.g., electrons) go through tunneling so as to change the magnetization direction of the free layer. The tunnel barrier layer 113 may include a single layer including magnesium oxide (MgO), calcium oxide (CaO), strontium oxide (SrO), titanium oxide (TiO), vanadium oxide (VO), or niobium oxide (NbO), or a multi-layer including at least two of them.

The semiconductor memory may include the protective layer 119 formed over the resultant structure in which the variable resistance patterns 116 is formed over the substrate 101. The protective layer 119 may cover the profile of the structure including the variable resistance patterns 116. The protective layer 119 may include a first protective layer 117 and a second protective layer 118. The first protective layer 117 has a uniform thickness over the surface of the structure including the variable resistance pattern 116. The second protective layer 118 is formed over the first protective layer 117 and has an overhang portion in or around the upper portions of the variable resistance patterns 116. The overhang portion of the second protective layer 118 in or around the upper portion of the variable resistance patterns 116 has greater thickness as compared with other portions of the second protective layer 118 The second protective layer 118 with the overhang portion prevents the variable resistance patterns 116 from being oxidized. For example, the variable resistance pattern 116 may not be oxidized in the process of oxidizing the protective layer 119 to form the leakage current blocking layer 119A.

The first protective layer 117 and the second protective layer 118 may include insulation layers, respectively, which may include the same material. When the variable resistance patterns 116 including a metallic layer are oxidized, the characteristics of the variable resistance patterns 116 may be drastically deteriorated. In order to prevent the variable resistance patterns 116 including a metallic layer from being deteriorated during the process of forming the first and second protective layers 117 and 118, each of the first protective layer 117 and the second protective layer 118 may include a nitride layer. For example, the first protective layer 117 and the second protective layer 118 may include silicon nitride layers (SiN). The nitrogen components have a low reactivity with a metallic material in comparison to oxygen components. Thus, the nitrogen components rarely affect the variable resistance patterns 116.

The first protective layer 117 and the second protective layer 118 may be formed through different deposition methods. The first protective layer 117 may be formed through a Chemical Vapor Deposition (CVD) process under a relatively low temperature. The CVD process provides excellent step coverage. The second protective layer 118 may be formed through a Physical Vapor Deposition (PVD) process which provides an excellent film quality while implementing the overhang structure. The film quality of the second protective layer 118 may be superior to the film quality of the first protective layer 117. In short, impurities of the second protective layer 118 may have a lower content than those of the first protective layer 117. For example, the impurity may include hydrogen. The amount of impurities, for example, hydrogen, in the first protective layer 117 and the second protective layer 118 may depend on the deposition temperature and the deposition methods. Since the second protective layer 118 has a superior film quality to the first protective layer 117, the second protective layer 118 may be thicker than the first protective layer 117. The deterioration in the film quality that is caused by the first protective layer 117 may be compensated using the second protective layer 118. Thus, this allows to maintain the excellent film quality through the overall protective layer 119

The protective layer 119 of the semiconductor memory may include the leakage current blocking layer 119A. The leakage current blocking layer 119A is formed by oxidizing the protective layer 119. For example, portions of the protective layer 119 may be oxidized to form the leakage current blocking layer 119A. The leakage current blocking layer 119A may be spaced apart from the variable resistance patterns 116. In other words, the leakage current blocking layer 119A does not contact with the variable resistance patterns 116. This is to prevent the characteristics of the variable resistance patterns 116 from being deteriorated due to the presence of the leakage current blocking layer 119A which includes oxygen components. Also, the leakage current blocking layer 119A may be discontinuous. In other words, the leakage current blocking layer 119A may be formed by oxidizing separate portions of the protective layer 119. In one implementation, the protective layer 119 may be formed on the surface of the portion of the protective layer 119. Referring to FIG. 2, the leakage current blocking layer 119A is formed on the surface of the portion of the protective layer 119 over the variable resistance patterns 116. In another implementation, the protective layer 119 may be formed in the inside of the portion of the protective layer 119. In another implementation, the protective layer 119 may be formed to occupy the whole of the portion of the leakage current blocking layer 119A. In FIG. 2, the leakage current blocking layer 119A occupies the whole of the portion of the protective layer 119, through which the source line contact plug 125 penetrates. The portions of protective layer 119 which are used to form the leakage current blocking layer 119A may not be connected one another. The leakage current blocking layer 119A is discontinuously disposed in the protective layer 119. For example, a portion of the leakage current blocking layer 119A may be spaced apart from the variable resistance pattern 116 to be disposed between the variable resistance patterns 116. When the leakage current blocking layer 119A is disposed between the variable resistance patterns 116, the source line contact plug 125 may penetrate through the portion. If the source line contact plug 125 penetrates through the leakage current blocking layer 119A, the leakage current blocking layer 119A may surround the source line contact plugs 125.

The leakage current blocking layer 119A functions to improve the leakage characteristics of the protective layer 119. The protective layer 119 includes a nitride having poor leakage characteristics in comparison with an oxide. The leakage current blocking layer 119A may be formed by selectively oxidizing portions of the protective layer 119. Thus, the leakage current blocking layer 119A includes an oxide having excellent leakage characteristics in comparison with a nitride. Therefore, the leakage current blocking layer 119A may include an oxynitride layer. For example, the leakage current blocking layer 119A may include a silicon oxynitride (SiON) layer which is obtained by oxidizing a silicon nitride (SiN) layer. The portions of the first protective layer 117 and the second protective layer 118 that are transformed to the leakage current blocking layer 119A may include silicon oxynitride layer. The portions of the protective layer that are transformed into the leakage current blocking layer 119A has superior leakage characteristics than other portions of the protective layer 119. The leakage current blocking layer 119A prevents the occurrence of a bridge that is caused by the protective layer 119 formed between the adjacent variable resistance patterns 116 and/or between the variable resistance pattern 116 and the source line contact plug 125. Thus, the reliability of the semiconductor memory can be improved.

The leakage current blocking layer 119A may be formed by selectively implanting oxygen ions into the protective layer 119. Herein, the second protective layer 118 having the overhang structure may function as an ion implantation barrier to prevent oxygen ions from being implanted into the variable resistance patterns 116. This will be described in detail later when explaining the fabrication method.

The semiconductor memory may include a second inter-layer dielectric layer 120, third contact plugs 121, and fourth contact plugs 122. The second inter-layer dielectric layer 120 is formed over the protective layer 119 including the leakage current blocking layer 119A. The third contact plugs 121 contact the top electrode 115 of the variable resistance patterns 116. The fourth contact plugs 122 contact the second contact plugs 110 The third and fourth contact plugs 121 and 122 may penetrate through the second inter-layer dielectric layer 120 and the protective layer 119. The second inter-layer dielectric layer 120 covers the profile of the structure including the protective layer 119 with the leakage current blocking layer 119A and the variable resistance patterns 116. The second inter-layer dielectric layer 120 may include a single layer including an oxide, a nitride, or an oxynitride, or a stacked layer including at least two of them.

The third contact plugs 121 and the fourth contact plugs 122 may be disposed to correspond to the first contact plugs 109 and the second contact plugs 110, respectively. The second contact plugs 110 and the fourth contact plugs 122 may function as the source line contact plugs 125. The source line contact plugs 125 may penetrate through the second inter-layer dielectric layer 120, the leakage current blocking layer 119A, and the first inter-layer dielectric layer 108. The third contact plugs 121 may penetrate through the leakage current blocking layer 119A.

The semiconductor memory may include the bit lines 123 and the source lines 124 that are formed over the second inter-layer dielectric layer 120 to contact with the third contact plugs 121 and the fourth contact plugs 122, respectively. The bit lines 123 and the source lines 124 may extend in the first direction. The bit lines 123 and the source lines 124 may be arranged to be spaced apart from each other in such a manner that the bit lines 123 and the source lines 124 are alternately disposed.

The semiconductor memory may include the protective layer 119 with the leakage current blocking layer 119A. In this way, although the protective layer 119 is formed of a nitride having poor leakage characteristics in comparison with an oxide, the deterioration of the characteristics of the variable resistance patterns 116, which may be caused due to the presence of the protective layer 119, may be avoided. By preventing the leakage originating from the protective layer 119, the reliability of the semiconductor memory may be improved.

In this implementation, the protective layer 119 with the leakage current blocking layer 119A has a stacked structure including the first protective layer 117 and the second protective layer 118. The first and second protective layers 117 and 118 have different film qualities from each other. Thus, the characteristics of the protective layer 119 itself may be improved, thereby further improving the reliability of the semiconductor memory.

FIGS. 3A through 3F are cross-sectional views for explaining a method for fabricating a semiconductor memory in accordance with an implementation of the present disclosure. The cross-sections are taken along the A-A' line of FIG. 1.

Figure 3A:
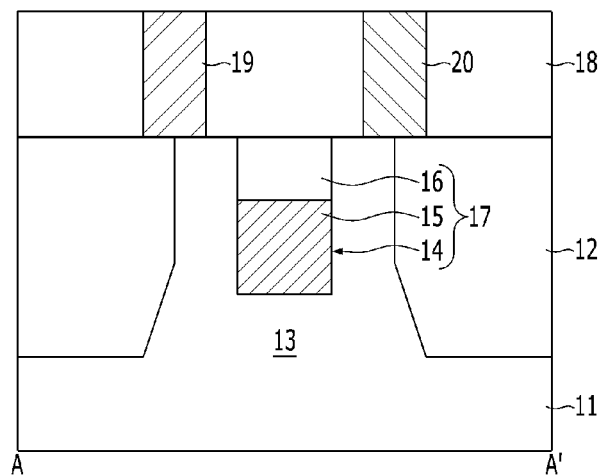

Referring to FIG. 3A, an isolation layer 12 for defining a plurality of active regions 13 is formed in a substrate 11. The substrate 11 may include a semiconductor substrate. The semiconductor substrate may include a monocrystalline silicon-containing material. For example, the substrate 11 may include a bulk silicon substrate, or a Silicon-On-Insulator (SOI) substrate. The isolation layer 12 for defining active regions 13 may be formed through a Shallow Trench Isolation (STI) process. The STI process includes forming isolation trenches by etching the substrate 11 and gap-filling the isolation trenches with an insulation material.

Subsequently, a plurality of buried gates 17 are formed in the substrate 11 across the active regions 13 and the isolation layer 12. The buried gates 17 may function as both word lines and selection elements. The buried gates 17 may be formed by etching the substrate 11 to form trenches 14, forming a gate insulation layer (not shown) on the surface of each trench 14, and forming a gate electrode 15 and a gate sealing layer 16 for gap-filling a portion of each trench 14 and the remaining portion of each trench 14, respectively.

Subsequently, a first inter-layer dielectric layer 18 is formed over the profile of the substrate 11. The first inter-layer dielectric layer 18 may include a single layer including an oxide layer, a nitride layer, or an oxynitride layer, or a stacked layer including at least two of them.

Subsequently, first contact plugs 19 and second contact plugs 20 are formed to penetrate through the first inter-layer dielectric layer 18. The first and second contact plugs 19 and 20 contact the active region 13 on different sides of each buried gate 17, respectively. The first contact plug 19 couples each variable resistance pattern 116, which is to be formed in the subsequent process, with the active region 13, The second contact plug 20 couples the source line 35, which is to be formed in the subsequent process, with the active region 13.

Figure 3B:
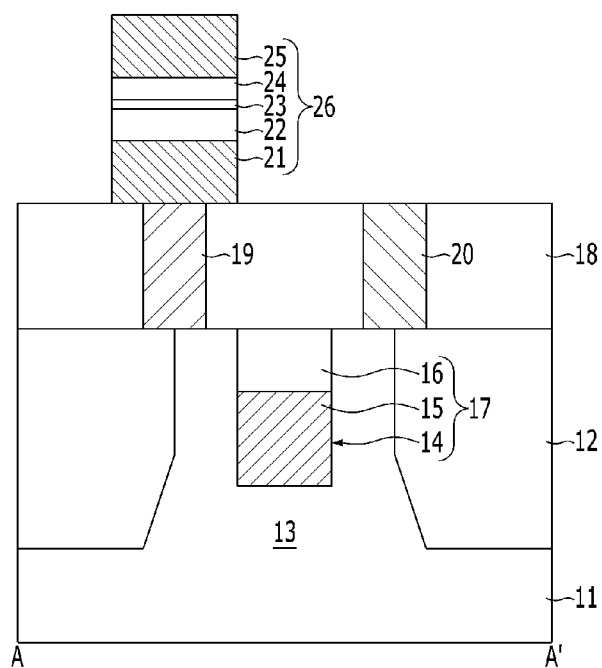

Referring to FIG. 3B, variable resistance patterns 26 are formed over the first inter-layer dielectric layer 18 to contact with the first contact plugs 19. The variable resistance patterns 26 may include a magnetic tunnel junction (MTJ). The variable resistance pattern 26 may include a stacked structure of a bottom electrode 21, a first magnetic layer 22, a tunnel barrier layer 23, a second magnetic layer 24, and a top electrode 25.

One of the first magnetic layer 22 and the second magnetic layer 24 serves as a reference layer or a pinned layer whose magnetization direction is fixed, and the other serves as a free layer whose magnetization direction is changed. Each of the first magnetic layer 22 and the second magnetic layer 24 may include a single layer including an iron-platinum (Fe—Pt) alloy, an iron-palladium (Fe—Pd) alloy, a cobalt-palladium (Co—Pd) alloy, a cobalt-platinum (Co—Pt) alloy, an iron-nickel-platinum (Fe—Ni—Pt) alloy, a cobalt-iron-platinum (Co—Fe—Pt) alloy, or a cobalt-nickel-platinum (Co—Ni—Pt) alloy, or a multi-layer including at least two of them. In the tunnel barrier layer 23, charges (e.g., electrons) go through tunneling so as to change the magnetization direction of the free layer. The tunnel barrier layer 23 may include a single layer including magnesium oxide (MgO), calcium oxide (CaO), strontium oxide (SrO), titanium oxide (TiO), vanadium oxide (VO), or niobium oxide (NbO), or a multi-layer including at least two of them.

The variable resistance patterns 26 may be formed by forming the stacked layer including an electrode layer, a magnetization layer, a barrier layer, another magnetization layer, and another electrode layer over the first inter-layer dielectric layer 18, and then performing an etch process on the stacked layer. Although not illustrated in the drawing, since the electrode layers and the magnetization layers include a metallic material, a conductive byproduct may be formed during the etch process. Even though a cleaning process is performed after the etch process, the conductive byproduct formed during the etch process may remain on the surface of the first inter-layer dielectric layer 18. The conductive byproduct remained may cause a bridge to occur between the variable resistance patterns 26 and/or between the variable resistance pattern 26 and source line contact plug.

Figure 3C:
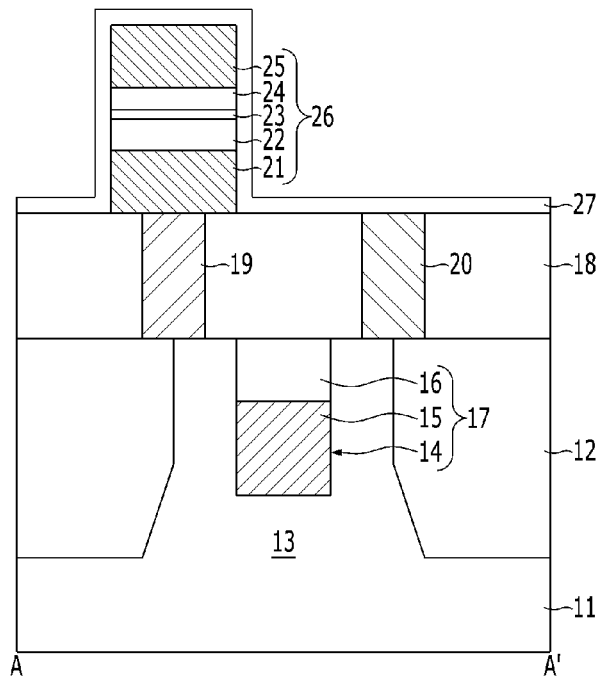

Referring to FIG. 3C, a first protective layer 27 may be formed to cover the profile of the structure including the variable resistance patterns 26. The first protective layer 27 may be formed to have a uniform thickness over the surface of the structure including the variable resistance patterns 26. In order to avoid any damages of the structure during the process of forming the first protective layer 27, the first protective layer 27 may be formed under a suitable deposition temperature using a suitable deposition method to include a suitable material.

The first protective layer 27 may include an insulation layer. The first protective layer 27 may include a nitride. In this case, the characteristics of the variable resistance patterns 26 including the metallic layer may not deteriorate. For example, the nitride may avoid oxidation of the surface of the variable resistance patterns 26 including the metallic layer. For example, the first protective layer 27 may include a silicon nitride (SiN) layer. Since nitrogen components have a lower reactivity to the metallic material than oxygen components, it may help to prevent the characteristics of the variable resistance patterns 26 from being deteriorated during the process of forming the first protective layer 27.

The first protective layer 27 may be formed through a Chemical Vapor Deposition (CVD) process under a low temperature. In this manner, the variable resistance pattern 26 including the metallic layer may not deteriorate. Further, the variable resistance pattern may have a uniform thickness over the structure including the variable resistance patterns 26. Further, the surface of the variable resistance patterns 26 may not be physically damaged during the formation of the first protective layer 27.

Since the first protective layer 27 is formed through the CVD process at a relatively low temperature, the first protective layer 27 may include impurity such as hydrogen. Due to the impurity, the film quality of the first protective layer 27 may decrease somewhat. In order to perform at least minimal passivation function, the first protective layer 27 may have a sufficient thickness.

Figure 3D:
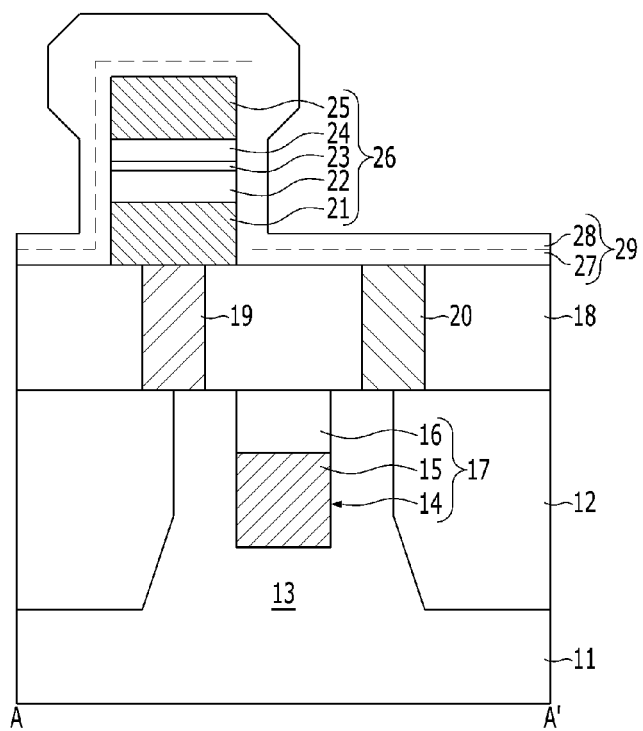

Referring to FIG. 3D, a second protective layer 28 is formed over the first protective layer 27 to cover the profile of the structure including the variable resistance patterns 26. The second protective layer 28 may have an overhang portion in or around the upper portion of the variable resistance patterns 26. The overhang portion of the second protective layer 28 has greater thickness than other portions of the second protective layer 28. For example, the second protective layer has a greater thickness around the upper portion of the variable resistance pattern.

The second protective layer 28 may include the same material as the first protective layer 27. For example, the second protective layer 28 may include a silicon nitride layer. The second protective layer 28 may have a superior (or denser) film quality than the first protective layer 27. The second protective layer 28 may have less amount of impurities, e.g., hydrogen, than the first protective layer 27. To increase the inferior film quality of the first protective layer 27 and maintain a certain level of the film quality, the second protective layer 28 may have a less amount of hydrogen than the first protective layer 27.

In order to form the second protective layer 28 to have an overhang structure and a denser film quality than the first protective layer 27, the second protective layer 28 may be formed through a Physical Vapor Deposition (PVD) process. i By using the first protective layer 27, it is possible to avoid any physical damages to the structure.

As a result, a protective layer 29 is formed to include the first and second protective layers 27 and 28. The first protective layer 27 has a uniform thickness over the profile of the variable resistance patterns 26. The second protective layer 28 has the overhang portion in or around the upper portion of the variable resistance patterns 26. The protective layer 29 may cover the overall profile of the structure including the variable resistance patterns 26.

Referring to FIG. 3E, a leakage current blocking layer 29A is formed by selectively oxidizing the protective layer 29. The portion of the protective layer 29 which is oxidized may form the leakage current blocking layer 29A. The leakage current blocking layer 29A may be formed by using the second protective layer 28 having the overhang structure. While using the second protective layer with the overhang structure as an ion implantation barrier, oxygen ions are implanted into the protective layer 29. Therefore, the portions of the protective layer 29 that are spaced apart by a predetermined distance from the variable resistance patterns 26 may be transformed into the leakage current blocking layer 29A.

If the protective layer 29 includes a silicon nitride layer, the leakage current blocking layer 29A which is formed by oxidizing the protective layer 29 may include a silicon oxynitride layer as well. The silicon oxynitride layer has superior leakage current to the silicon nitride layer. Thus, it is more difficult to transfer charges through the silicon oxynitride layer than through the silicon nitride layer.

The leakage current blocking layer 29A may be formed on various positions of the protective layer according to the depth of the ion implantation that is performed to form the leakage current blocking layer 29A. For example, the leakage current blocking layer 29A may be formed on the surface of the protective layer 29 as illustrated in the drawing. In another implementation, the leaking current blocking layer 29A may be formed inside of the protective layer 29.

The metallic byproduct remaining on the surface of the first inter-layer dielectric layer 18 may be oxidized in the course of forming the leakage current blocking layer 29A. After oxidization, the metallic byproduct may form an insulative byproduct. Therefore, by forming the leakage current blocking layer 29A, it is possible to prevent occurrence of a bridge which is caused by the metallic byproduct between the variable resistance patterns 26 and/or between the variable resistance pattern 26 and source line contact plug 33.

Figure 3F:
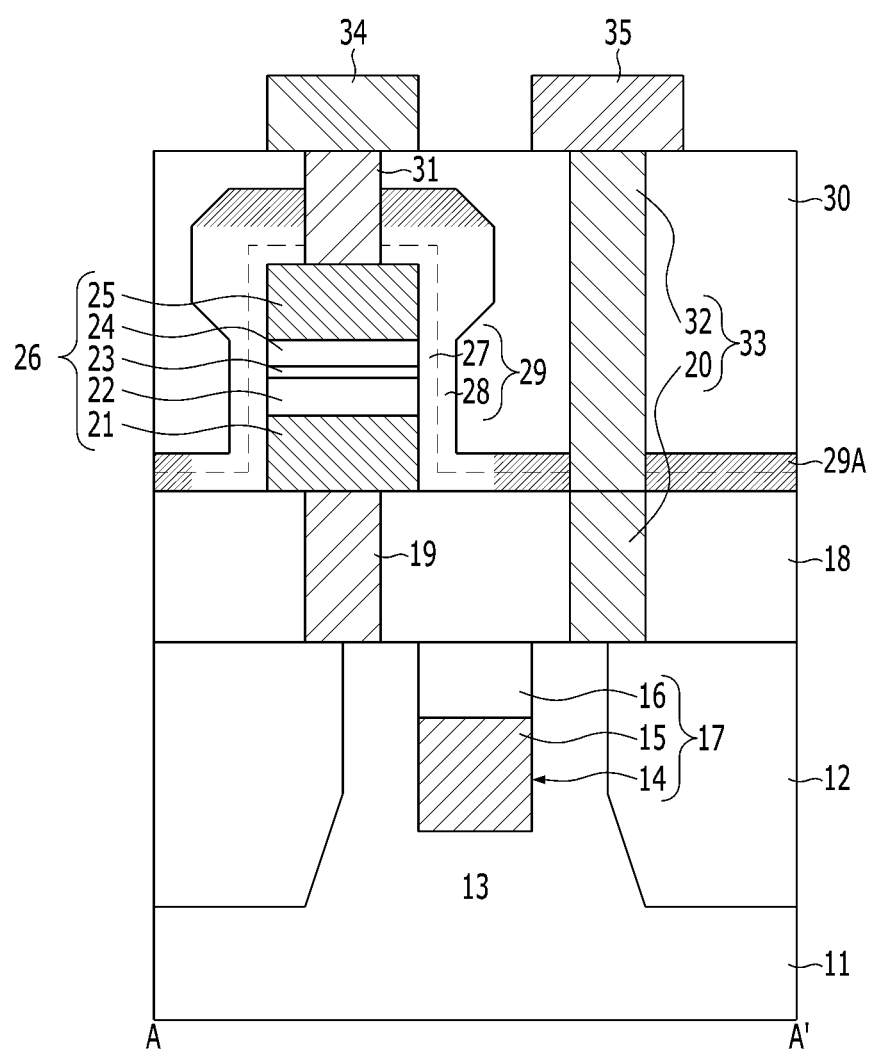

Referring to FIG. 3F, a second inter-layer dielectric layer 30 is formed over the protective layer 29 including the leakage current blocking layer 29A. The second inter-layer dielectric layer 30 may include a single layer including an oxide layer, a nitride layer, or an oxynitride layer, or a stacked structure including at least two of them.

Third contact plugs 31 and fourth contact plugs 32 are formed to penetrate through the protective layer 29 including the second inter-layer dielectric layer 30 and the leakage current blocking layer 29A. Third contact plugs 31 and fourth contact plugs 32 contact with the top electrodes 25 of the variable resistance patterns 26 and second contact plugs 20, respectively. The second contact plugs 20 and the fourth contact plugs 32 serve as the source line contact plug 33. The source line contact plug 33 may have a shape penetrating through the second inter-layer dielectric layer 30, the leakage current blocking layer 29A, and the first inter-layer dielectric layer 18.

Subsequently, a bit line 34 and a source line 35 are formed over the second inter-layer dielectric layer 30. The bit line 34 and the source line 35 contact with the third contact plugs 31 and the source line contact plugs 33, respectively.

Subsequently, although not illustrated in the drawing, the fabrication of the semiconductor memory may be completed through available semiconductor fabrication technologies.

Since the protective layer 29 includes portions which are transformed to the leakage current blocking layer 29A, although the protective layer 29 includes a nitride having poor leakage characteristics in comparison with an oxide, the leakage characteristics can be compensated. By using the nitride for the protective layer 29, the characteristics of the variable resistance patterns 26 may not deteriorate. As a result, the reliability of the semiconductor memory may be improved.

The protective layer 29 including the leakage current blocking layer 29A has a stacked structure of the first protective layer 27 and the second protective layer 28 which include different film qualities. Thus, the characteristics of the protective layer 29 itself may be improved. Further, the reliability of the semiconductor memory can be improved.

Since the second protective layer 28 has the overhang structure, the characteristics of the variable resistance patterns 26 may be prevented from being deteriorated during the formation of the leakage current blocking layer 29A. Further, the leakage current blocking layer 29A may be easily formed, which is spaced apart from the variable resistance patterns 26 by a predetermined gap may be easily formed.

The above and other memory circuits or semiconductor devices based on the disclosed technology can be used in a range of devices or systems. FIGS. 4-8 provide some examples of devices or systems that can implement the memory circuits disclosed herein.

Figure 4:
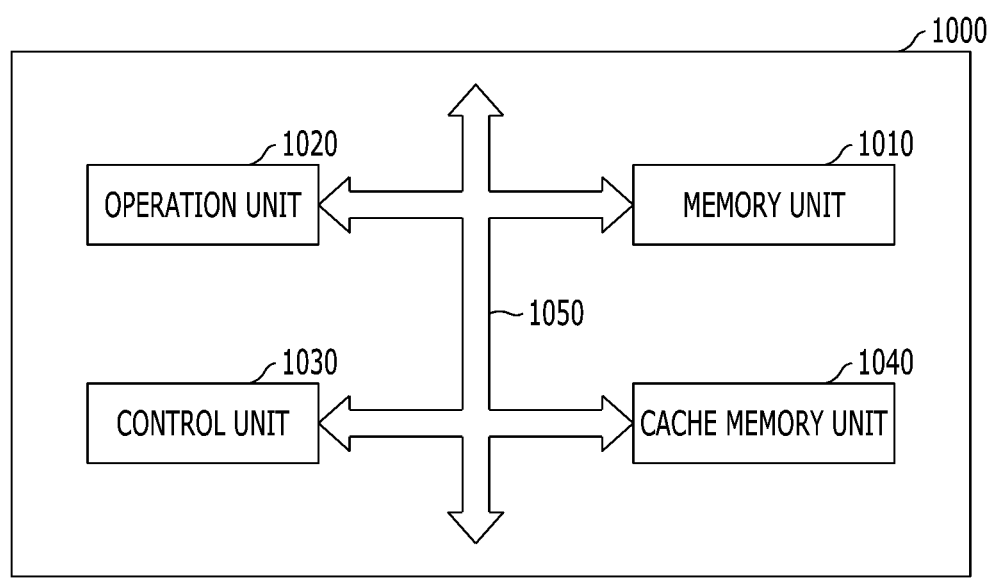
FIG. 4 is a block view of an example of a microprocessor including a memory device in accordance with an implementation of the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the memory unit 1010 may be improved. As a consequence, it is possible to improve a reliability of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
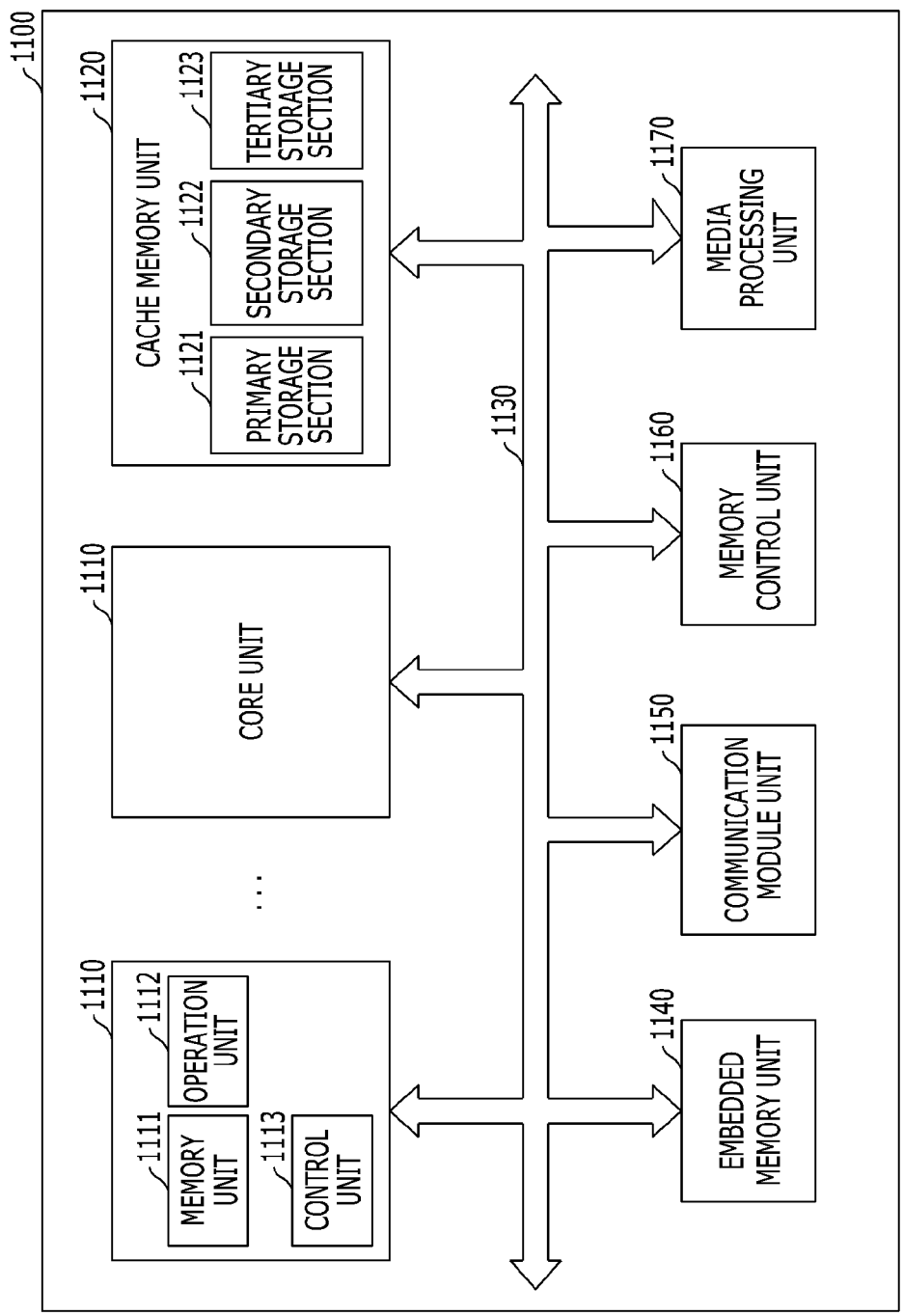
FIG. 5 is a block view of an example of a processor including a memory device in accordance with an implementation of the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the cache memory unit 1120 may be improved. As a consequence, it is possible to improve a reliability of the processor 1100.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
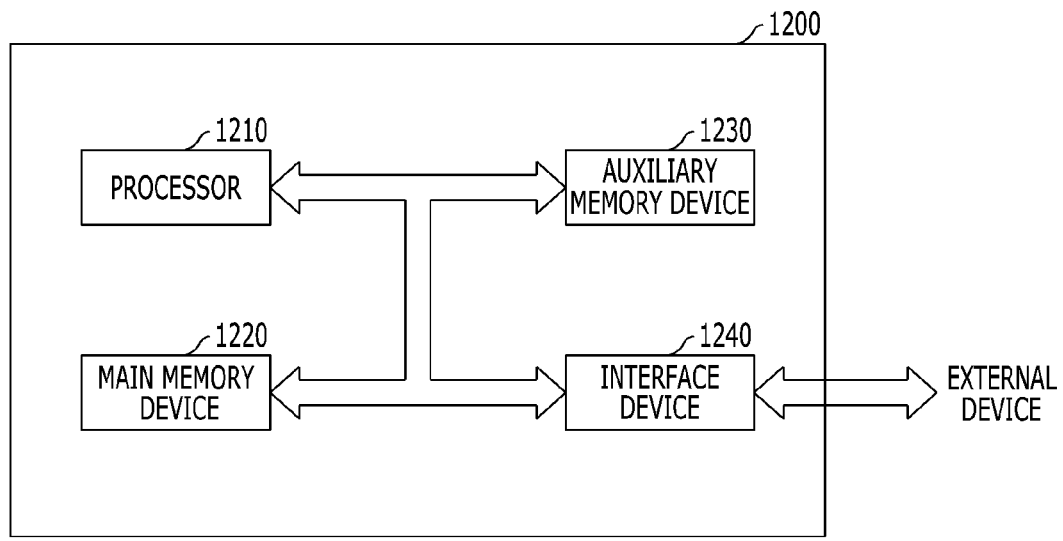
FIG. 6 is a block view of an example of a system including a memory device in accordance with an implementation of the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the system 1200 may be improved. As a consequence, it is possible to improve a reliability of the processor 1100. Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the auxiliary memory device 1230 may be improved. As a consequence, it is possible to improve a reliability of the system 1200. Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
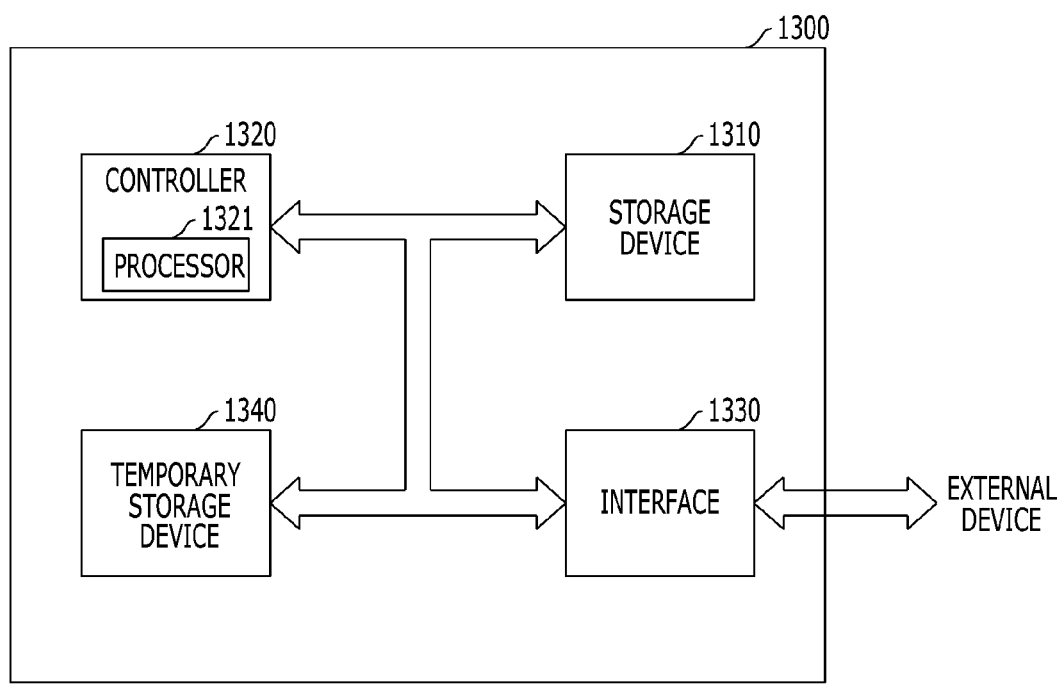
FIG. 7 is a block view of an example of a data storage system including a memory device in accordance with an implementation of the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the temporary storage device 1340 may be improved. As a consequence, it is possible to improve a reliability of the data storage system 1300

Figure 8:
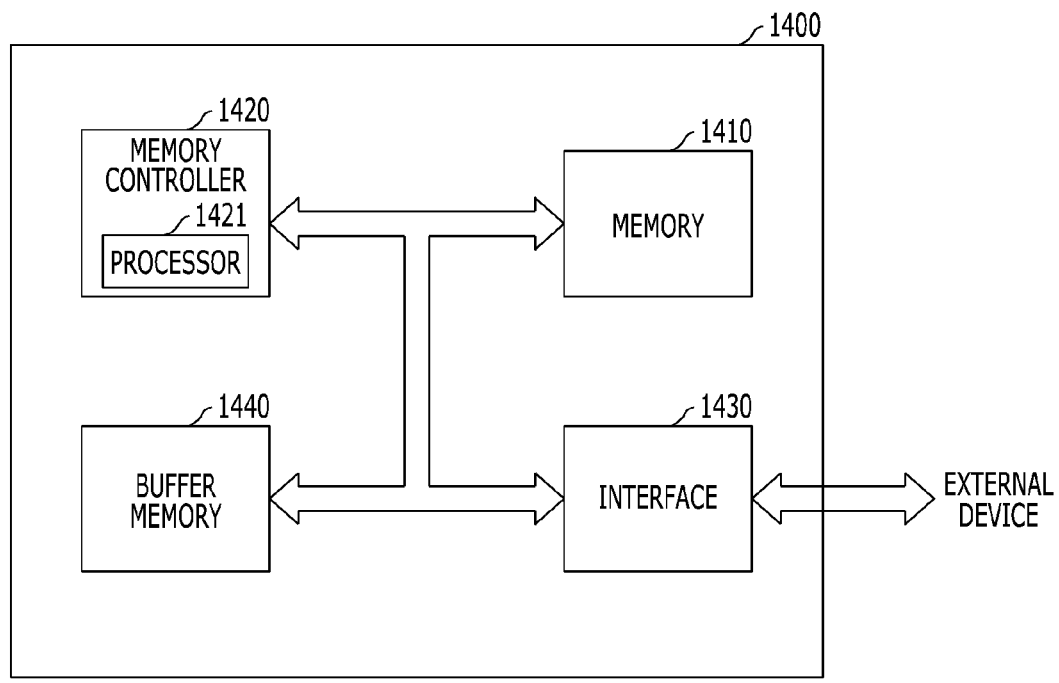
FIG. 8 is a block view of an example of a memory system including a memory device in accordance with an implementation of the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the memory 1410 may be improved. As a consequence, it is possible to improve a reliability of the memory system 1400. Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a semiconductor memory unit includes: variable resistance patterns formed over a substrate; a protective layer formed over the substrate including the variable resistance patterns and including a leakage current blocking layer that may be spaced apart from the variable resistance patterns; and contact plugs formed adjacent to the variable resistance patterns over the substrate and penetrating through the protective layer to be coupled with the substrate. Through this, data storage characteristics of the buffer memory 1440 may be improved. As a consequence, it is possible to improve a reliability of the memory system 1400. Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
    a first interlayer dielectric layer which is formed over a substrate;
    a variable resistance pattern formed over the first interlayer dielectric layer;
    a protective layer formed over the substrate to cover the variable resistance pattern and the first interlayer dielectric layer; and
    a contact plug formed adjacent to the variable resistance pattern over the substrate and configured to be located outside the protective layer to penetrate through the first interlayer dielectric layer to be coupled with the substrate,
    wherein the protective layer includes (1) a first protective layer that has a uniform thickness and is in contact with the variable resistance pattern and the first interlayer dielectric layer and (2) a second protective layer that is in contact with the first protective layer to cover the first protective layer, has a spatially varying thickness in different parts of the second protection layer to include an overhang portion in contact with an upper portion of a sidewall of and a top portion above the variable resistance pattern to protect the variable resistance pattern from oxidation.

2. The electronic device according to claim 1, further comprising a leakage current blocking layer that is spaced apart from the variable resistance pattern to cover the first interlayer dielectric layer and to contact a sidewall of the protective layer, wherein the leakage current blocking layer is disposed at a position such that the contact plug penetrates through the leakage current blocking layer and the first interlayer dielectric layer to be coupled to the substrate, and the leakage current blocking layer surrounds the contact plug.

3. The electronic device according to claim 2, wherein the protective layer and the leakage current blocking layer are formed of different materials.

4. The electronic device according to claim 2, wherein the leakage current blocking layer includes an oxide.

5. The electronic device according to claim 2, wherein the protective layer includes a nitride, and the leakage current blocking layer includes an oxynitride.

6. The electronic device according to claim 1, wherein the variable resistance pattern includes a magnetic tunneling junction including a tunnel barrier interposed between two magnetic layers.

7. The electronic device according to claim 1, further including:
    a selection element formed in the substrate, and the contact plug is electrically connected to the selection element.

8. The electronic device according to claim 1, further including another contact plug located above the variable resistance pattern and penetrating through the protective layer to be electrically connected to the variable resistance pattern.

9. The electronic device according to claim 1, further comprising a leakage current blocking layer that is in contact with the protective layer and is formed of a material that is different from a material of the protective layer, wherein the leakage current blocking layer includes a portion formed over the variable resistance pattern and the portion is disposed on a surface of the protective layer or inside the protective layer.

10. The electronic device according to claim 1, further comprising a leakage current blocking layer that is spaced apart from the variable resistance pattern to cover the first interlayer dielectric layer and to contact a sidewall of the protective layer, wherein the leakage current blocking layer includes a material, which is different from a material of the protective layer.

11. The electronic device according to claim 1, wherein the first protective layer and the second protective layer include the same material.

12. The electronic device according to claim 11, wherein the second protective layer has a denser film quality than the first protective layer.

13. An electronic device comprising a semiconductor memory unit that includes:
    a substrate;
    a first interlayer dielectric layer over the substrate;
    a plurality of variable resistance patterns formed over the first interlayer dielectric layer, wherein each variable resistance pattern exhibits different resistance values to store data;
    a protective layer formed over the first interlayer dielectric layer and variable resistance patterns, wherein the protective layer includes a first material; and
    a leakage current blocking layer formed over portions of the substrate to cover spaces between the variable resistance patterns over the first interlayer dielectric layer and to be in contact with the protective layer, wherein the leakage current blocking layer includes a second material having better leakage characteristics than the first material,
    wherein the protective layer includes (1) a first protective layer that has a uniform thickness and is in contact with the variable resistance patterns and the first interlayer dielectric layer and (2) a second protective layer that is in contact with the first protective layer to cover the first protective layer, and has a spatially varying thickness in different parts of the second protection layer to include an overhang portion in contact with an upper portion of a sidewall of and a top portion above each variable resistance pattern to protect the variable resistance pattern from oxidation.

14. The electronic device of claim 13, wherein the protective layer and the leakage current blocking layer are interleaved over the first interlayer dielectric layer to form portions of the protective layer that are discontinuous from portions of the leakage current blocking layer.

15. The electronic device of claim 13, wherein
the first material includes a nitride and the second material includes an oxide.

16. The electronic device of claim 13, wherein the second protective layer has a superior film quality to the first protective layer.

17. The electronic device of claim 13, wherein
the leakage current blocking layer is free of a contact with the variable resistance patterns.

18. An electronic device comprising a semiconductor memory unit that includes:
a substrate;
an interlayer dielectric layer over the substrate;
a plurality of variable resistance patterns formed over the interlayer dielectric layer, wherein each variable resistance pattern exhibits different resistance values to store data;
a protective layer formed over the interlayer dielectric layer and patterned to include different protective layer regions that cover the variable resistance patterns, wherein the protective layer includes (1) a first protective layer that has a spatially uniform thickness and is in contact with the variable resistance patterns and (2) a second protective layer that is in contact with the first protective layer to cover the first protective layer, and has a spatially varying thickness in different parts of the second protection layer to include an overhang portion in contact with an upper portion of a sidewall of and a top portion above each variable resistance pattern to protect the variable resistance pattern from oxidation;
a leakage current blocking layer formed over the interlayer dielectric layer and patterned to include different leakage current blocking layer portions located in spaces between the variable resistance patterns, wherein the leakage current blocking layer and the protective layer have different material compositions to prevent current leakage originating from the protective layer;
buried gates formed in the substrate; and
contact plugs located between the variable resistance patterns to penetrate through the leakage current blocking layer and the interlayer dielectric layer to contact the buried gates, wherein each contact plug is coupled to at least one buried gate.

19. The electronic device of claim 13, wherein the leakage current blocking layer includes a material that is an oxidized material of a material forming the protective layer.

20. The electronic device according to claim 13, wherein each variable resistance pattern includes a magnetic tunneling junction including a tunnel barrier interposed between two magnetic layers.

21. The electronic device according to claim 13, comprising:
second contact plugs formed over the substrate to respectively correspond to the variable resistance patterns and to be electrically coupled to the variable resistance patterns, respectively; and
a memory circuit coupled to the second contact plugs and the contact plugs to control operations of the variable resistance patterns.

* * * * *